(12) United States Patent
Chen et al.

(10) Patent No.: US 7,550,820 B2
(45) Date of Patent: Jun. 23, 2009

(54) REVERSE-BIASED PN DIODE DECOUPLING CAPACITOR

(75) Inventors: Hsien-Te Chen, Hsin-Chu (TW); Jen-Hang Yang, Yonghe (TW); Chun-Hui Tai, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/502,094

(22) Filed: Aug. 10, 2006

(65) Prior Publication Data

US 2008/0122036 A1    May 29, 2008

(51) Int. Cl.
*H01L 29/93* (2006.01)
(52) U.S. Cl. .................... 257/601; 257/312; 257/355; 257/E29.344
(58) Field of Classification Search ............. 361/91.5; 357/23.13, 42; 257/313, 355, 173, 356, 603, 257/E27.073, E29.335, 312, 594, 595, 598, 257/599, 601, E29.344, E27.049
See application file for complete search history.

(56) References Cited

U.S. PATENT DOCUMENTS

| | | | | |
|---|---|---|---|---|
| 4,626,882 A | * | 12/1986 | Cottrell et al. | 257/357 |
| 5,122,855 A | * | 6/1992 | Shirai | 257/370 |
| 2005/0212049 A1 | * | 9/2005 | Onodera | 257/355 |
| 2007/0157144 A1 | * | 7/2007 | Mai et al. | 716/10 |

* cited by examiner

*Primary Examiner*—Evan Pert
*Assistant Examiner*—Selim Ahmed
(74) *Attorney, Agent, or Firm*—K & L Gates LLP

(57) ABSTRACT

This invention discloses a decoupling capacitor in an integrated circuit, comprising a plurality of dedicated PN diodes with a total junction area greater than one tenth of a total active area of functional devices for which the dedicated PN diodes are intended to protect, a N-type region of the dedicated PN diodes coupling to a positive supply voltage (Vdd), and a P-type region of the dedicated PN diodes coupling to a complimentary lower supply voltage (Vss), wherein the dedicated PN diodes are reversely biased.

20 Claims, 4 Drawing Sheets

REVERSE-BIASED PN DIODE DECOUPLING CAPACITOR

BACKGROUND

The present invention relates generally to integrated circuits, and, more particularly, to decoupling capacitors in integrated circuits.

Decoupling capacitors (decaps) are used in integrated circuit (IC) design to filter out noise coupling between a positive supply voltage (Vdd) and a complimentary lower supply voltage (Vss). Such power noises are caused by transistors in a high density IC demanding high current at high frequencies, which results in abrupt voltage drops. There can be both global and localized voltage drops on the power grid of the IC. This voltage drop can be reduced by providing localized sources of current, such as capacitors, which decouple current surges from the power grid, and thereby reduce noise on the power grid.

One type of on-die capacitor is called a MOS-C or metal oxide semiconductor capacitor. The MOS-C has two terminals separated by a gate oxide. One of the terminals is the gate and the other is the body. Another type of on-die capacitor is using a field effect transistor (FET) such as an n-channel metal oxide semiconductor FET (NMOSFET) or a p-channel metal oxide semiconductor FET (PMOSFET). One of the terminals is the gate and the other terminal is the source, drain, and body. The terminals are separated by a gate oxide. One common feature in these two types of on-die capacitor is to use gate oxide as dielectric material, which suffers high leakage current tunneling through the gate oxide, especially in modern semiconductor devices where gate oxide is becoming ever thinner. Gate oxide directly connect to the Vdd is also prone to electrostatic discharge (ESD) damage.

What is desired is a low leakage decap with flexibility in formation and robust to damages.

SUMMARY

In view of the foregoing, This invention discloses a decoupling capacitor in an integrated circuits, comprising a plurality of dedicated PN diodes with a total junction area greater than one tenth of a total active area of functional devices for which the dedicated PN diodes are intended to protect, a N-type region of the dedicated PN diodes coupling to a positive supply voltage (Vdd), and a P-type region of the dedicated PN diodes coupling to a complimentary lower supply voltage (Vss), wherein the dedicated PN diodes are reversely biased.

The construction and method of operation of the invention, however, together with additional objects and advantages thereof will be best understood from the following description of specific embodiments when read in connection with the accompanying drawings.

DESCRIPTION

The present disclosure provides decoupling capacitors formed by reverse-biased PN diodes which have lower leakage and are flexible to be placed in integrated circuits.

Figure 1:
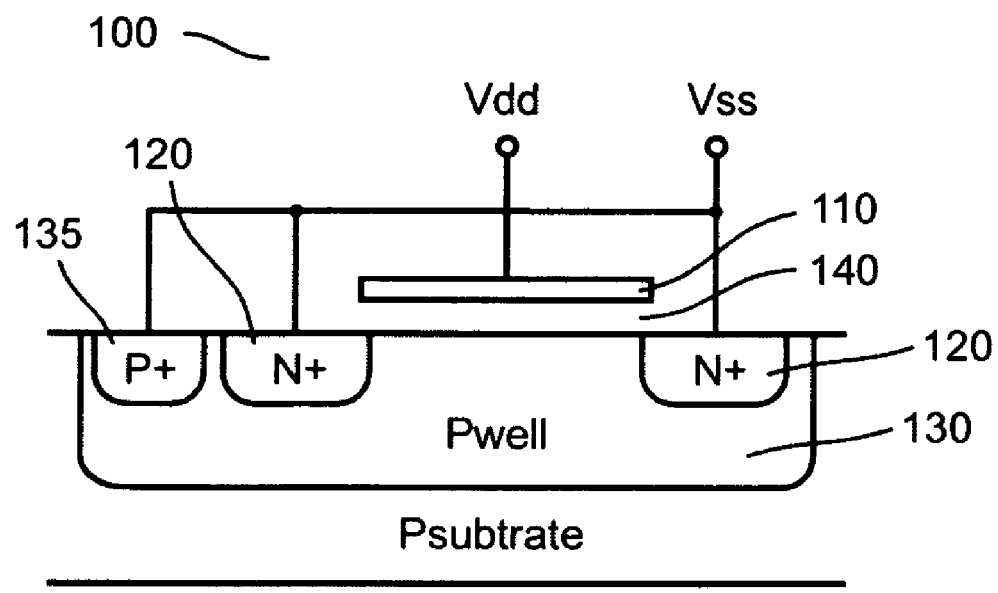
FIG. 1 is a cross sectional view of a traditional NMOSFET decoupling capacitor.

FIG. 1 is a cross sectional view of a traditional NMOSFET decoupling capacitor (decap) 100. A gate 110 is coupled to a positive voltage supply (Vdd). A source/drain 120 and a Pwell bulk 130 are tied together and coupled to a complimentary lower voltage supply (Vss). The gate oxide 140 provide dielectric material for the NMOSFET decap 100, which operates at inversion region where the capacitance is higher under the aforementioned connection. But using gate oxide to form decaps suffer high leakage current tunneling through the gate oxide, especially in modern semiconductor devices where gate oxide is becoming ever thinner. Gate oxide directly connect to the Vdd is also prone to electrostatic discharge (ESD) damage.

Figure 2:
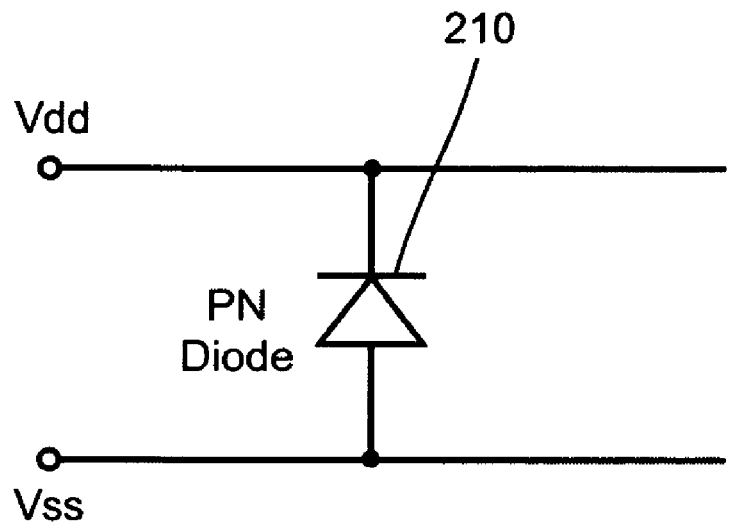
FIG. 2 is a schematic diagram illustrating a reverse-biased PN diode serving as a decoupling capacitor according to one embodiment of the present invention.

FIG. 2 is a schematic diagram illustrating a reverse-biased PN diode 210 serving as a decap according to one embodiment of the present invention. A reverse-biased PN diode 210 can serve as a capacitor is because under reverse bias, the PN junction forms a depletion region, and the higher the bias voltage the wider the depletion region, and hence the smaller the PN junction capacitance. So the reverse-biased PN diode decap 210 works even better when Vdd becomes lower in advanced integrated circuits (ICs).

Another advantage of the reverse-biased PN diode decap is an added electrostatic discharge (ESD) protection. Since PN junction breakdown under modest ESD voltage is reversible, meaning the PN junction itself will not be permanently damaged by modest ESD.

Figure 3A:
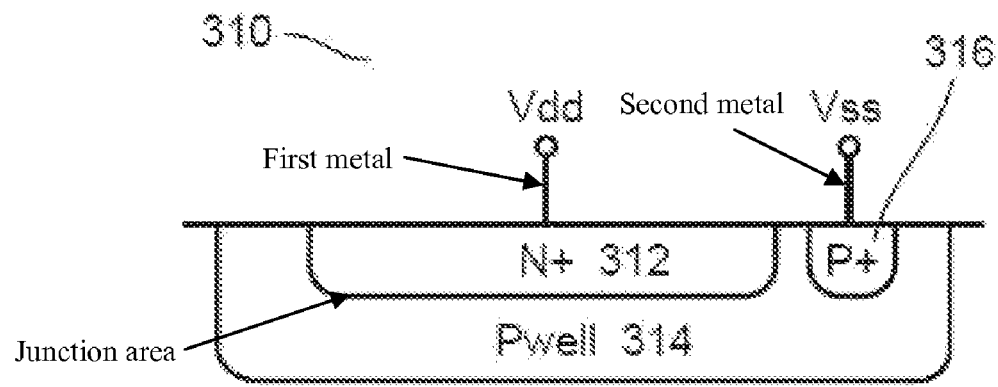
FIGS. 3A, 3B and 3C are cross sectional views of various formations of the reverse-biased PN diode decoupling capacitors.
Figure 3B:
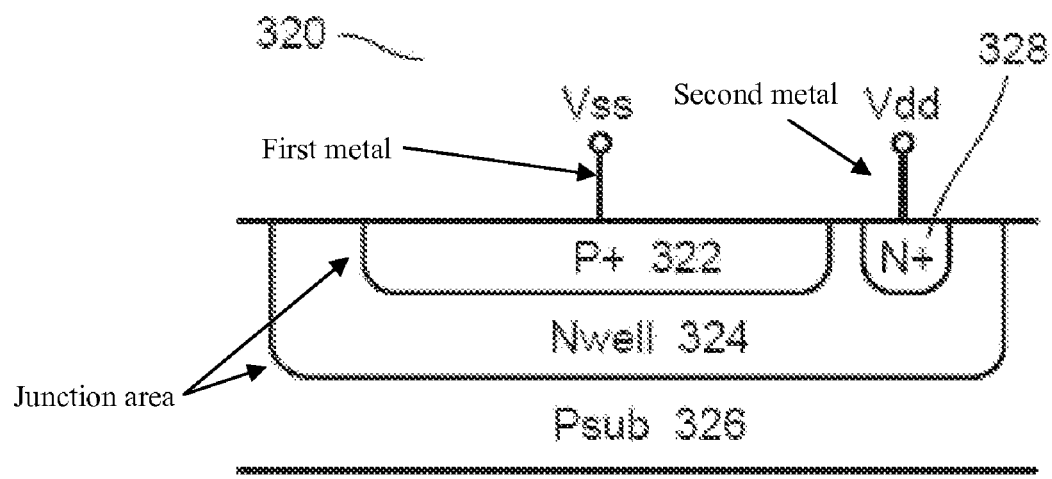
Figure 3C:
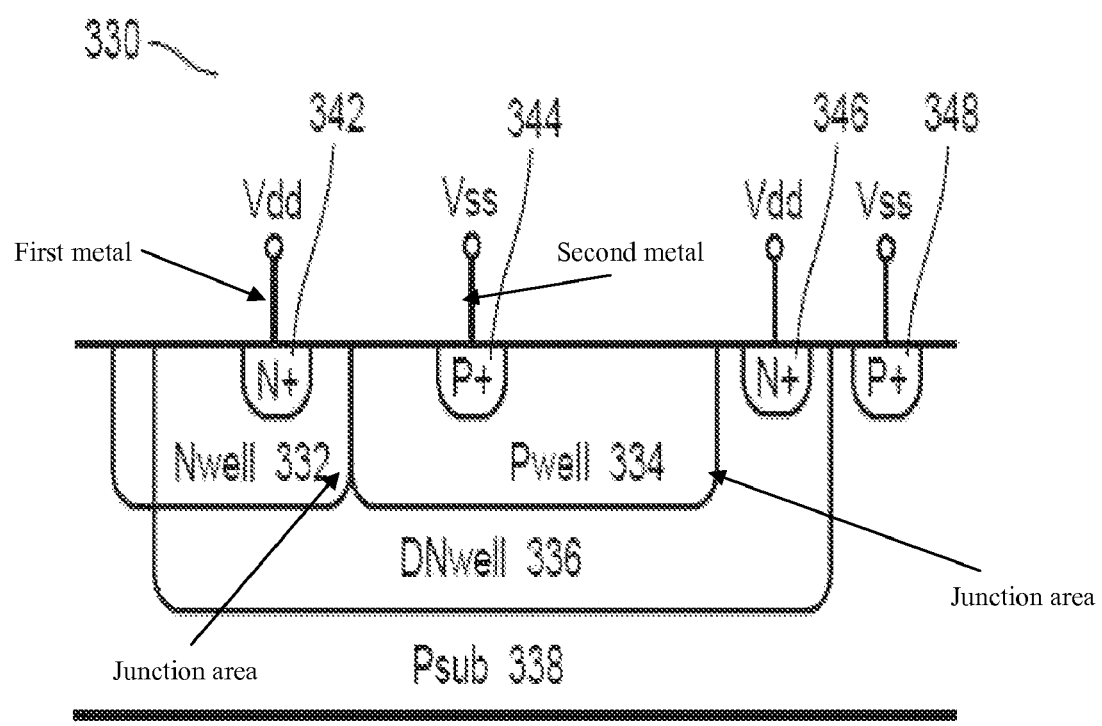

There are numerous ways to form a PN diode in an IC chip, and FIGS. 3A through 3C show some of the examples. Here only dedicated PN diodes are referred to according to the present invention. A dedicated PN diode is a device functioning solely as a PN diode, and not a PN diode parasitic to other kind of devices.

FIG. 3A is a cross sectional view of a reverse-biased PN diode decap 310 formed by a N+ region 312 inside a Pwell 314. The N+ region 312 is coupled to Vdd and the Pwell 314 is coupled to Vss through a P+ pick-up region 316. So that the PN junction formed by the N+ 310 and Pwell 316 is reverse biased.

FIG. 3B is a cross sectional view of another reverse-biased PN diode decap 320 formed by a P+ region 322 inside a Nwell 324 which is in turn inside a Psub 326. The Nwell 324 is coupled to Vdd through a N+ pick-up region 328. The P+ region 322 is coupled to Vss. So that the PN junction formed by the P+ 322 and Nwell 324 is also reverse biased.

FIG. 3C is a cross sectional view of a more complicated structure. A Nwell 332 is next to a Pwell 334. Both Nwell 332 and Pwell 334 are inside a DNwell (deep Nwell) 336, which is in turn inside as Psub 338. The Nwell 322 is coupled to Vdd through a N+ pick-up region 342. The Pwell 334 is coupled to Vss through a P+ pick-up region 344. The DNwell 336 is coupled to Vdd through a N+ pick-up region 346. The Psub 338 is coupled to Vss through a P+ pick-up region 348. So that the Nwell 332 and the Pwell 334 forms a reverse-biased PN diode. The Pwell 334 and the DNwell 336 forms another reverse-biased PN diode. The DNwell 336 and the Psub 338 forms yet another reverse-biased PN diode.

In order for the PN diode decaps to be effective in filtering out noises created by a fluctuating power demand, a total junction area of the PN diode decaps must be substantially in par with the total size of functional devices in the same region where the decaps are placed. If in a normal circuit, most functional devices use minimum channel width, and then the functional device active area can be used as a representative for the device size. The total junction area of the PN diode decaps should be at least one tenth of the total active area of the functional devices for which the dedicated PN diodes are intended to protect.

FIGS. 3A, 3B and 3C demonstrate the flexibility of forming a reverse-biased PN diode decap. It can be extremely large formed from DNwell and Psub, or it can be a small 2-pitch filler type decap. The so called filler is a non-functional element placed in empty areas to fill up metal, poly, well and active regions in order to satisfy density rules of these layers.

Figure 4:
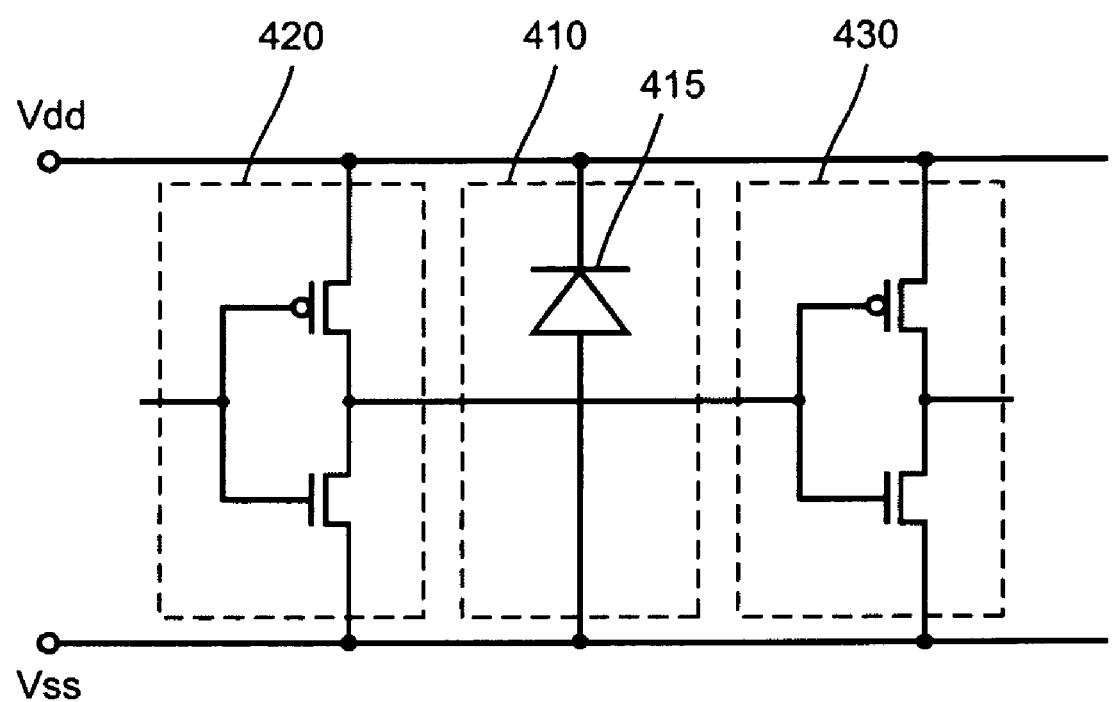
FIG. 4 is a schematic diagram illustrating the placement of a filler cell formed by a reverse-biased PN diodes decoupling capacitor according to one embodiment of the present invention.

FIG. 4 is a schematic diagram illustrating the placement of a filler cell 410 formed by a reverse-biased PN diodes decoupling capacitor 415 according to one embodiment of the present invention. Inverters 420 and 430 are exemplary functional devices. They can be any other kind of devices. The filler cell 410 are placed in the empty spaces between the two functional inverters 420 and 430, firstly to serve as a decoupling capacitor, and secondly to fill up the empty spaces to satisfy density rules for metal, poly, well and active region layers. If the filler cell 410 is near a bonding pad, the reverse-biased PN junction can also provide additional ESD protection to the internal circuits.

The PN diode of the filler cell is coupled between Vdd and Vss through metal lines in the same or two different metal layers. In order to dump sufficient electric charges in a dynamic basis, the metal lines should have enough width to reduce resistance. In fact, the width or length of the filler cell should be no greater than five times, and preferably three times, the minimum width of the metal lines.

As a part of a filler cell, some dummy pieces in layers, such as metal or poly, may be added if the area where the filler cell is placed is deprived of those layers. The so called dummy piece is a piece of a certain layer do not have any functional use and purely for filling up empty spaces to satisfy density rules.

This invention provides many different embodiments, or examples, for implementing different features of the invention. Specific examples of components and methods are described to help clarify the disclosure. These are, of course, merely examples and are not intended to limit the disclosure from that described in the claims.

What is claimed is:

1. A filler cell in an integrated circuit comprising:
   one or more dummy elements of one or more predetermined layers;
   at least one or more dedicated PN diode, wherein the dedicated PN diode includes:
   an N+ region formed in a P-type well, the N+ region being coupled to a positive supply voltage (Vdd) by a first metal; and
   the P-type well being coupled to a complimentary lower supply voltage (Vss) by a second metal through a P+ pick-up region formed in the P-type well, wherein a total junction area of the dedicated PN diode formed by the N+ region and the P-type well is greater than one tenth of a total active area of functional devices for which the dedicated PN diode is intended to protect.

2. The filler cell of claim 1, wherein the filler cell is placed in an empty space between at least two functional devices.

3. The filler cell of claim 1, wherein a width or a length of the filler cell is no greater than three times a minimum width of the first or second metal.

4. The filler cell of claim 1, wherein a width or a length of the filler cell is no greater than five times a minimum width of the first or second metal.

5. The filler cell of claim 1, wherein the one or more dummy elements are used for filling up empty spaces to satisfy density rules.

6. The filler cell of claim 1, wherein the first and second metals are made of the same layer.

7. A filler cell in an integrated circuit comprising:
   one or more dummy elements of one or more predetermined layers;
   one or more dedicated PN diode, wherein the dedicated PN diode includes:
   a P+ region formed within an N-type well, the P+ region being coupled to a complimentary lower supply voltage (Vss) by a first metal; and
   the N-type well formed in a P-type substrate, the N-type well being coupled to a positive supply voltage (Vdd) by a second metal through an N+ pick-up region, wherein the dedicated PN diode formed by the P+ region and the N-type well is reversely biased to serve as a decoupling capacitor, and
   wherein a total junction area of the dedicated PN diode is greater than one tenth of a total active area of functional devices for which the dedicated PN diode is intended to protect.

8. The filler cell of claim 7, wherein the filler cell is placed in an empty space between at least two functional devices.

9. The filler cell of claim 7, wherein a width or a length of the filler cell is no greater than three times a minimum width of the first or second metal.

10. The filler cell of claim 7, wherein a width or a length of the filler cell is no greater than five times a minimum width of the first or second metal.

11. The filler cell of claim 7, wherein the one or more dummy elements are used for filling up empty spaces to satisfy density rules.

12. The filler cell of claim 7, wherein the filler cell is non-functional element placed in empty areas.

13. The filler cell of claim 6, wherein the predetermined layer includes metal, well or active region layer.

14. The filler cell of claim 6, wherein the first and second metals are made of the same layer.

15. A filler cell in an integrated circuit comprising:
   one or more dummy elements of one or more predetermined layers;
   one or more dedicated PN diode, wherein the dedicated PN diode includes:
   a first N+ region formed within an N-type well, the first N+ region being coupled to a positive supply voltage (Vdd) by a first metal;
   a first P+ region formed within a P-type well disposed next to the N-type well, the first P+ region being coupled to a complimentary lower supply voltage (Vss) by a second metal; and
   a deep N-type well formed in a P-type substrate, the deep N-type well being coupled to the positive supply voltage (Vdd) through a second N+ region formed in the deep N-type well, wherein both the N-type well and the P-type well are formed in the deep N-type well,
   wherein the dedicated PN diode formed by the N-type well and the P-type well is reversely biased to serve as a decoupling capacitor, and wherein a total junction area of the dedicated PN diode is greater than one tenth of a total active area of functional devices for which the dedicated PN diode is intended to protect.

16. The filler cell of claim 15, wherein the filler cell is placed in an empty space between at least two functional devices.

17. The filler cell of claim 15, wherein a width or a length of the filler cell is no greater than three times a minimum width of the first or second metal.

18. The filler cell of claim 15, wherein a width or a length of the filler cell is no greater than five times a minimum width of the first or second metal.

19. The filler cell of claim 15, wherein the one or more dummy elements are used for filling up empty spaces to satisfy density rules.

20. The filler cell of claim 15, wherein the first and second metals are made of the same layer.

* * * * *